United States Patent
Jo et al.

(10) Patent No.: US 10,476,441 B2
(45) Date of Patent: Nov. 12, 2019

(54) ENVELOPE TRACKING CURRENT BIAS CIRCUIT AND POWER AMPLIFYING DEVICE

(71) Applicant: Samsung Electro-Mechanics Co., Ltd., Suwon-si (KR)

(72) Inventors: Byeong Hak Jo, Suwon-si (KR); Jong Ok Ha, Suwon-si (KR); Jeong Hoon Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 15/985,995

(22) Filed: May 22, 2018

(65) Prior Publication Data

US 2019/0115872 A1      Apr. 18, 2019

(30) Foreign Application Priority Data

Oct. 17, 2017    (KR) .................. 10-2017-0134509

(51) Int. Cl.
*H03G 3/20*      (2006.01)
*H03F 1/02*      (2006.01)
*H03F 3/345*     (2006.01)
*H03G 3/30*      (2006.01)
*H03F 3/21*      (2006.01)
(Continued)

(52) U.S. Cl.
CPC .......... *H03F 1/0222* (2013.01); *H03F 3/19* (2013.01); *H03F 3/21* (2013.01); *H03F 3/245* (2013.01); *H03F 3/345* (2013.01); *H03G 3/3042* (2013.01); *H03F 2200/102* (2013.01); *H03F 2200/451* (2013.01)

(58) Field of Classification Search
CPC ....................................................... H03G 3/20
USPC ............................................... 330/136, 129
See application file for complete search history.

(56) References Cited

U.S. PATENT DOCUMENTS 3,475,688 A * 10/1969 Masonson ............ H04B 7/0865
                                                                 330/136
4,220,929 A *  9/1980 Talbot .................... H03G 7/002
                                                                 330/136
(Continued)

FOREIGN PATENT DOCUMENTS

KR    10-2002-0064768 A     8/2002
KR    10-2008-0092802 A    10/2008
(Continued)

OTHER PUBLICATIONS

Korean Office Action issued on Jul. 26, 2019 in corresponding Korean Application No. 10-2017-0134509 (7 pages in English, 6 pages in Korean).

*Primary Examiner* — Henry Choe
(74) *Attorney, Agent, or Firm* — NSIP Law

(57) ABSTRACT

An envelope tracking (ET) current bias circuit includes a rectifying circuit, a phase compensation circuit, and a voltage/current conversion circuit. The rectifying circuit is configured to detect an envelope voltage from a radio frequency (RF) signal. The phase compensation circuit is configured to compensate for a phase of the envelope voltage in which the phase thereof is delayed in the rectifying circuit to output a phase compensated enveloped voltage. The voltage/current conversion circuit is configured to convert the phase compensated envelope voltage into an ET bias current.

14 Claims, 4 Drawing Sheets

(51) Int. Cl.
*H03F 3/19* (2006.01)
*H03F 3/24* (2006.01)

(56) References Cited

U.S. PATENT DOCUMENTS

| | | | | |
|---|---|---|---|---|
| 4,398,157 | A * | 8/1983 | Dieterich | H03G 7/00 |
| | | | | 330/136 |
| 5,281,925 | A * | 1/1994 | Hulick | H03F 1/0261 |
| | | | | 327/170 |
| 5,532,646 | A * | 7/1996 | Aihara | H03F 1/0266 |
| | | | | 330/136 |
| 6,873,208 | B2 * | 3/2005 | Shinjo | H03F 1/0261 |
| | | | | 330/129 |
| 8,902,002 | B2 * | 12/2014 | Fagg | H03F 1/0266 |
| | | | | 330/127 |
| 9,331,653 | B2 | 5/2016 | Khesbak et al. | |
| 2003/0048135 | A1 | 3/2003 | Shinjo et al. | |
| 2008/0253312 | A1 | 10/2008 | Park | |
| 2009/0097591 | A1 | 4/2009 | Kim | |
| 2010/0150262 | A1 | 6/2010 | Kim et al. | |
| 2014/0097893 | A1 | 4/2014 | Ajima | |

FOREIGN PATENT DOCUMENTS

| | | |
|---|---|---|
| KR | 10-2009-0036670 A | 4/2009 |
| KR | 10-2010-0069126 A | 6/2010 |
| WO | 2012/164951 A1 | 12/2012 |

\* cited by examiner

ENVELOPE TRACKING CURRENT BIAS CIRCUIT AND POWER AMPLIFYING DEVICE

CROSS-REFERENCE TO RELATED APPLICATION

This application claims the benefit under 35 USC 119(a) of Korean Patent Application No. 10-2017-0134509 filed on Oct. 17, 2017 in the Korean Intellectual Property Office, the entire disclosure of which is incorporated herein by reference for all purposes.

BACKGROUND

1. Field

The present disclosure relates to an envelope tracking current bias circuit and a power amplifying device.

2. Description of Related Art

In general, a power amplifier (PA) serves to amplify a radio frequency (RF) signal in a radio communication band to be transmitted by an antenna. The PA of a portable device, such as a smartphone, typically uses a larger amount of current than other components in the portable device and should satisfy a high linearity condition.

Typically, there are various methods for improving PA characteristics. Among such methods, as a method for improving characteristics of amplitude modulation (AM)/AM, AM/phase modulation (PM), and the like of the PA, there is a method for providing a bias using an envelope of the RF signal applied to the PA.

As described above, in order to provide the bias using the envelope of the RF signal, the conventional power amplification circuit may include an envelope tracking (ET) current bias circuit.

However, since the conventional ET current bias circuit includes elements that may delay a phase, such as, for example, a diode, a resistor element (a R element), a capacitor element (a C element), an operational amplifier, and the like, there may be a problem in that an ET bias current may be delayed for several nanoseconds (ns) to several tens of nanoseconds.

As described above, in a case in which the ET bias current is delayed as compared to the RF signal, since the RF signal and the ET bias current have a phase difference and a change of the ET bias current is also delayed according to a change of the RF signal, deterioration of the signal or power waste may occur, which may cause inefficient operations.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an envelope tracking (ET) current bias circuit includes a rectifying circuit, a phase compensation circuit, and a voltage/current conversion circuit. The rectifying circuit is configured to detect an envelope voltage from a radio frequency (RF) signal. The phase compensation circuit is configured to compensate for a phase of the envelope voltage in which the phase thereof is delayed in the rectifying circuit to output a phase compensated enveloped voltage. The voltage/current conversion circuit is configured to convert the phase compensated envelope voltage into an ET bias current.

The phase compensation circuit may include a phase compensator and a selector. The phase compensator may be configured to comprise first to n-th phase compensators that sequentially compensate for the phase of the envelope voltage from the rectifying circuit using a predetermined phase compensation value. The selector may be configured to select one of first to n-th output voltages output from the first to n-th phase compensators to output the selected output voltage to the voltage/current conversion circuit.

Each of the first to n-th phase compensators may be configured to vary a phase compensation value for compensating for the phase of the envelope voltage output from the rectifying circuit according to a first control signal.

The phase compensation circuit may include a phase leading circuit and an amplification circuit. The phase leading circuit may be configured to compensate for the phase of the envelope voltage from the rectifying circuit using a phase compensation value varied responsive to a first control signal to output the phase compensated envelope voltage. The amplification circuit may be configured to amplify the phase compensated envelope voltage output from the phase leading circuit to compensate for amplitude of a signal reduced by the phase leading circuit.

The phase leading circuit may include a capacitor circuit, a first resistor circuit, and a second resistor circuit. The capacitor circuit may be connected between an input terminal and an output terminal of the phase leading circuit. The first resistor circuit may be connected to the capacitor circuit in parallel. The second resistor circuit may be connected between the output terminal of the phase leading circuit and a ground and having a resistance value varied responsive to the first control signal.

The amplification circuit may include an operational amplifier, a third resistor circuit, and a fourth resistor circuit. The operational amplifier having an inverting input terminal and a non-inverting input terminal may receive the phase compensated envelope voltage input from the phase leading circuit. The third resistor circuit may be connected between an output terminal and the non-inverting input terminal of the operational amplifier. The fourth resistor circuit may be connected between the non-inverting input terminal of the operational amplifier and a ground and having a resistance value varied according to the first control signal.

In another general aspect, a power amplifying device includes a power amplifier, an envelope tracking (ET) current bias circuit, and a VCC circuit. The power amplifier is configured to amplify a radio frequency (RF) signal. The envelope tracking (ET) current bias circuit is configured to generate an ET bias current to provide the generated ET bias current to the power amplifier. The ET current bias circuit includes a rectifying circuit, a phase compensation circuit, and a voltage/current conversion circuit. The rectifying circuit is configured to detect an envelope voltage from the RF signal. The phase compensation circuit is configured to compensate for a phase of the envelope voltage in which the phase thereof is delayed in the rectifying circuit to output a phase compensated enveloped voltage. The voltage/current conversion circuit is configured to convert the phase compensated envelope voltage input from the phase compensation circuit into an ET bias current. The VCC circuit is configured to generate a source voltage to provide the generated source voltage to the power amplifier.

The phase compensation circuit may include a phase compensator and a selector. The phase compensator may be configured to comprise first to n-th phase compensators that sequentially compensate for the phase of the envelope voltage from the rectifying circuit using a predetermined phase compensation value. The selector may be configured to select one of first to n-th output voltages output from the first to n-th phase compensators to output the selected output voltage to the voltage/current conversion circuit.

Each of the first to n-th phase compensators may be configured to vary a phase compensation value for compensating for the phase of the envelope voltage output from the rectifying circuit responsive to a first control signal.

The phase compensation circuit may include a phase leading circuit and an amplification circuit. The phase leading circuit may be configured to compensate for the phase of the envelope voltage from the rectifying circuit using a phase compensation value varied according to a first control signal to output the phase compensated envelope voltage. The amplification circuit may be configured to amplify the phase compensated envelope voltage output from the phase leading circuit to compensate for amplitude of a signal reduced by the phase leading circuit.

The phase leading circuit may include a capacitor circuit, a first resistor circuit, and a second resistor circuit. The capacitor circuit may be connected between an input terminal and an output terminal of the phase leading circuit. The first resistor circuit may be connected to the capacitor circuit in parallel. The second resistor circuit may be connected between the output terminal of the phase leading circuit and a ground and having a resistance value varied responsive to the first control signal.

The amplification circuit may include an operational amplifier, a third resistor circuit, and a fourth resistor circuit. The operational amplifier having an inverting input terminal and a non-inverting input terminal may receive the phase compensated envelope voltage input from the phase leading circuit. The third resistor circuit may be connected between an output terminal and the non-inverting input terminal of the operational amplifier. The fourth resistor circuit may be connected between the non-inverting input terminal of the operational amplifier and a ground and having a resistance value varied responsive to the first control signal.

The rectifying circuit may include a first rectifying circuit, a second rectifying circuit, and a first operation circuit. The first rectifying circuit may be configured to detect the envelope of the RF signal and output an envelope detection signal comprising a first direct current (DC) offset voltage. The second rectifying circuit may be configured to output a second DC offset voltage corresponding to the first DC offset voltage. The first operation circuit may be configured to output an envelope signal in which the first DC offset voltage is reduced as a function of the envelope detection signal and the second DC offset voltage.

The voltage/current conversion circuit may include a first V/I conversion circuit, a second V/I conversion circuit, and a bias current generating unit. The first V/I conversion circuit may be configured to convert a reference voltage into a DC current and adjust the DC current responsive to a third control signal. The second V/I conversion circuit may be configured to generate an ET current using the envelope signal and adjust the ET current responsive to a third control signal SC3. The bias current generating unit may be configured to generate the ET bias current based on the DC current and the ET current.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
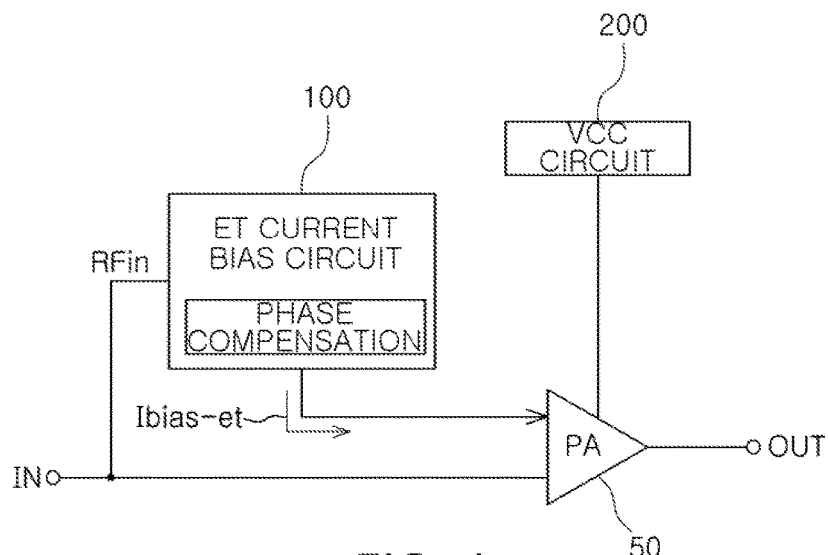
FIG. 1 is a schematic block diagram of an example of a power amplifying device.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a schematic block diagram of an example of a power amplifying device.

Referring to FIG. 1, a power amplifying device according to an example in the present disclosure includes a power amplifier (PA) 50, an envelope tracking (ET) current bias circuit 100, and a VCC circuit 200.

First, the VCC circuit 200 generates a source voltage VCC that may be provided to the power amplifier (PA). As an example, the VCC voltage is a fixed voltage, an ET VCC voltage based on an envelope of a RF signal, or an average power tracking (APT) VCC based on an average for each of the sections for the envelope of the RF signal, but is not limited thereto.

The ET current bias circuit 100 may compensate for a phase of an ET bias current Ibias_et generated based on an envelope of an RF signal RFin to provide the phase compensated ET bias current to the power amplifier 50. The ET current bias circuit 100 may also compensate for a phase delay generated in a process of detecting an envelope voltage from the RF signal by compensating for the phase of the bias current, thereby improving an adjacent channel power ratio (ACPR).

The ET current bias circuit 100 will be described in more detail with reference to FIGS. 2 and 7.

The power amplifier (PA) 50 amplifies the RF signal RFin, input through an input terminal IN, and outputs the amplified RF signal through an output terminal OUT. As an example, the power amplifier (PA) 50 includes at least one amplifying transistor. The amplifying transistor is supplied with the VCC voltage and the bias current, and may be a bipolar junction transistor requiring the bias current.

Figure 2:
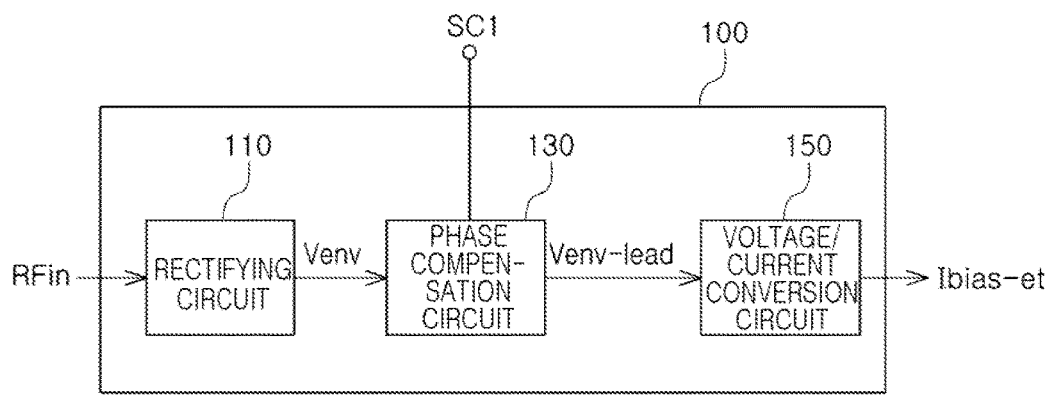
FIG. 2 is a schematic block diagram of an example of an envelope tracking current bias circuit.

FIG. 2 is a schematic block diagram of an envelope tracking current bias circuit according to an example in the present disclosure.

Referring to FIG. 2, the ET current bias circuit 100 includes a rectifying circuit 110, a phase compensation circuit 130, and a voltage/current conversion circuit 150.

The rectifying circuit 110 may detect an envelope voltage Venv from the RF signal RFin. As an example, since the rectifying circuit 110 includes a phase delay element such as a diode, a phase of the envelope voltage Venv may be delayed in a rectifying process.

The phase compensation circuit 130 compensates for the phase of the envelope voltage Venv, phase-delayed in the rectifying circuit 110, to output the phased compensated envelope voltage Venv_lead. As an example, the phase compensation circuit 130 includes a phase leading element to compensate for the delayed phase.

The voltage/current conversion circuit 150 converts the phase compensated envelope voltage Venv_lead, input from the phase compensation circuit, into the ET bias current Ibias_et. As an example, the voltage/current conversion circuit 150 includes at least one V/I conversion circuit.

In addition, the phase compensation circuit 130 may include a circuit capable of varying a phase compensation value according to a first control signal SC1.

Figure 3:
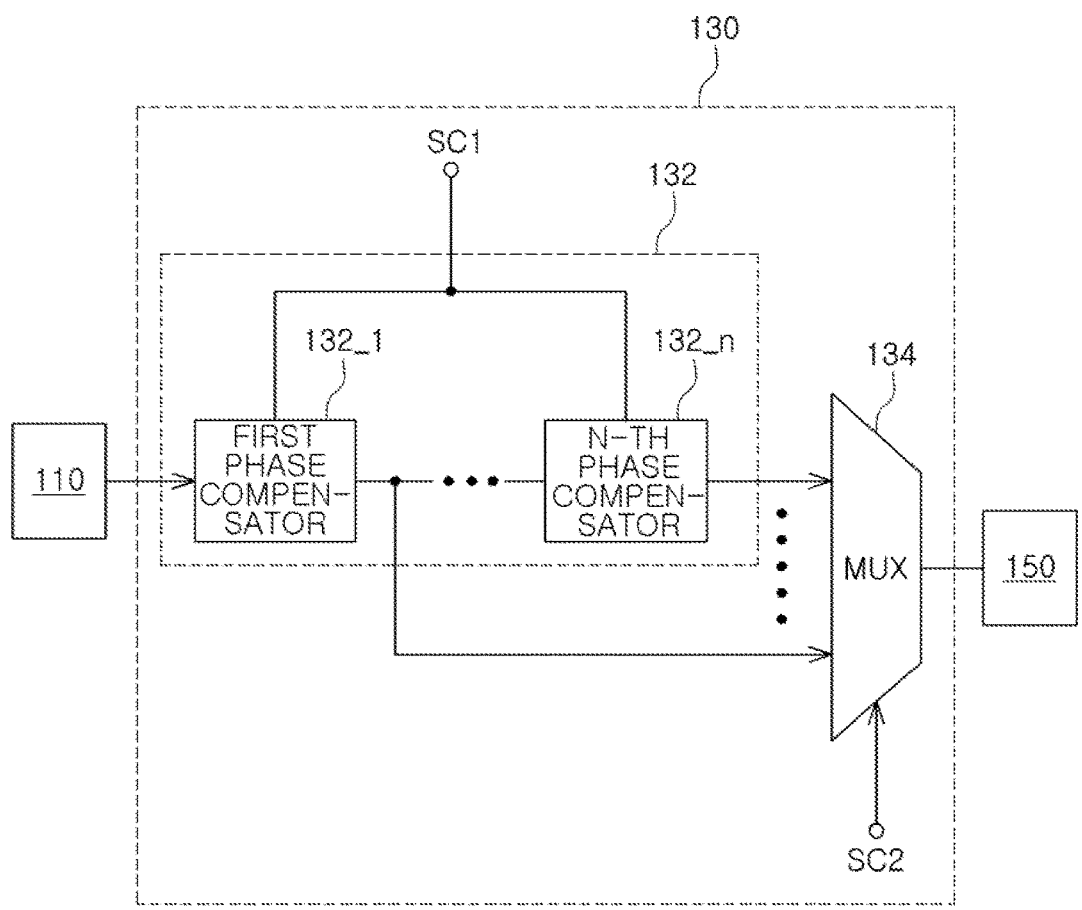
FIG. 3 is an illustrative diagram of an example of a phase compensation circuit.

FIG. 3 is an illustrative diagram of a phase compensation circuit according to an example in the present disclosure.

Referring to FIG. 3, the phase compensation circuit 130 may include a phase compensator 132 and a selector 134.

The phase compensator 132 includes first to n-th phase compensators 132_1 to 132_n, connected in series with each other. The first to n-th phase compensators 132_1 to 132_n may sequentially compensate for the phase of the envelope voltage Venv from the rectifying circuit 110 using a predetermined phase compensation value.

As an example, each of the first to n-th phase compensators 132_1 to 132_n varies the phase compensation value for compensating for the phase of the envelope voltage Venv, output from the rectifying circuit 110, according to the first control signal SC1.

The selector 134 selects one of first to n-th output voltages, output from the first to n-th phase compensators 132_1 to 132_n in response to a second control signal, to output the selected output voltage to the voltage/current conversion circuit 150.

As an example, the selector 134 includes a multiplexer Mux that selects one of the plurality of first to n-th output voltages based on the second control signal SC2.

The first control signal SC1 and the second control signal SC2 described above may be provided by a control circuit (not shown) configured with a predetermined phase compensation value.

Figure 4:
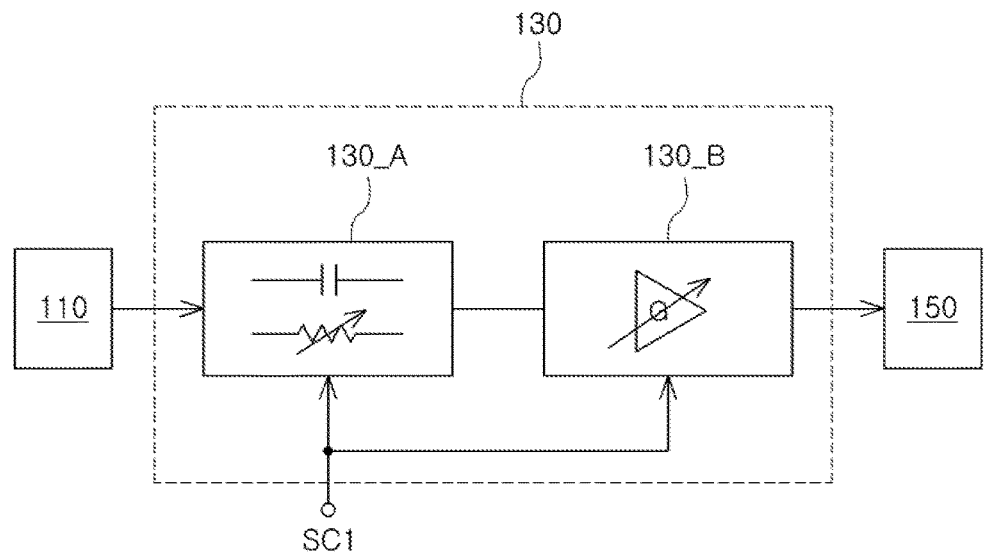
FIG. 4 is an illustrative diagram of another example of a phase compensation circuit.

FIG. 4 is an illustrative diagram of a phase compensation circuit according to another example in the present disclosure.

Referring to FIG. 4, the phase compensation circuit 130 includes a phase leading circuit 130_A and an amplification circuit 130_B.

The phase leading circuit 130_A compensates for the phase of the envelope voltage Venv from the rectifying circuit 110 using the phase compensation value varied based on the first control signal SC1 to output the phase compensated envelope voltage Venv_lead. As an example, the phase leading circuit 130_A includes a capacitor circuit and a resistor circuit, and at least one of the capacitor circuit and the resistor circuit may be a variable circuit and may vary the phase compensation value according to the first control signal SC1.

The amplification circuit 130_B amplifies the phase compensated envelope voltage Venv_lead, output from the phase leading circuit 130_A to compensate for amplitude of a signal reduced by the phase leading circuit 130_A.

As an example, the amplification circuit 130_B is a gain variable amplification circuit that varies a gain G based on the first control signal SC1.

Figure 5:
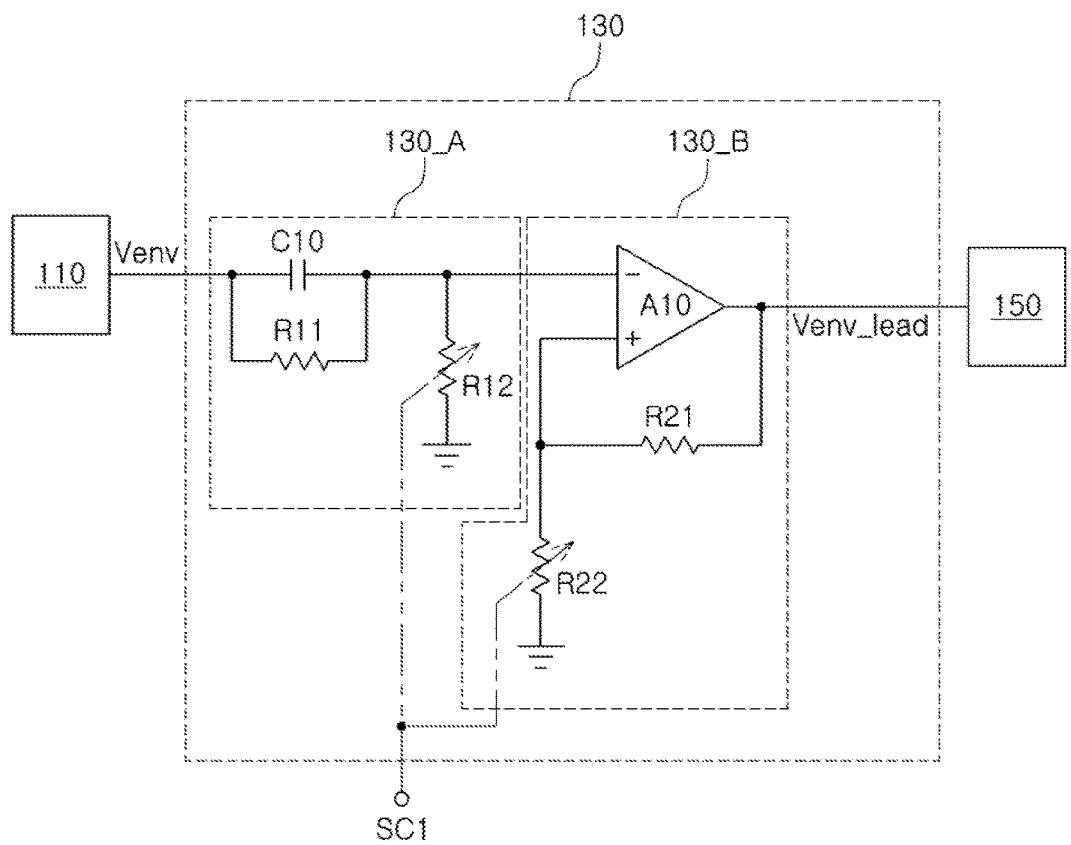
FIG. 5 is an illustrative diagram of one implementation of the phase compensation circuit of FIG. 4.

FIG. 5 is an illustrative diagram of one implementation of the phase compensation circuit of FIG. 4.

Referring to FIG. 5, the phase leading circuit 130_A includes a capacitor circuit C11, a first resistor circuit R11, and a second resistor circuit R12.

The capacitor circuit C11 may be connected between an input terminal and an output terminal of the phase leading circuit 130_A.

The first resistor circuit R11 is connected to the capacitor circuit in parallel C11.

The second resistor circuit R12 is connected between the outer terminal of the phase leading circuit 130_A and a ground.

As an example, the second resistor circuit R12 includes a resistance value varied according to the first control signal SC1.

In addition, at least one of the first resistor circuit R11, the second resistor circuit R12, and the capacitor circuit C11 may include a resistance value or capacitance varied to vary a phase compensation according to the first control signal SC1.

The amplification circuit 130_B includes an operational amplifier A10, a third resistor circuit R21, and a fourth resistor circuit R22.

The operation amplifier A10 may include an inverting input terminal and a non-inverting input terminal receiving the phase compensated envelope voltage Venv_lead input from the phase leading circuit 130_A.

The third resistor circuit R21 is connected between an output terminal and the non-inverting input terminal of the operational amplifier A10.

The fourth resistor circuit R22 is connected between the non-inverting input terminal of the operational amplifier A10 and a ground.

As an example, at least one of the third resistor circuit R21 and the fourth resistor circuit R22 includes a resistance value varied according to the first control signal SC1.

Figure 6:
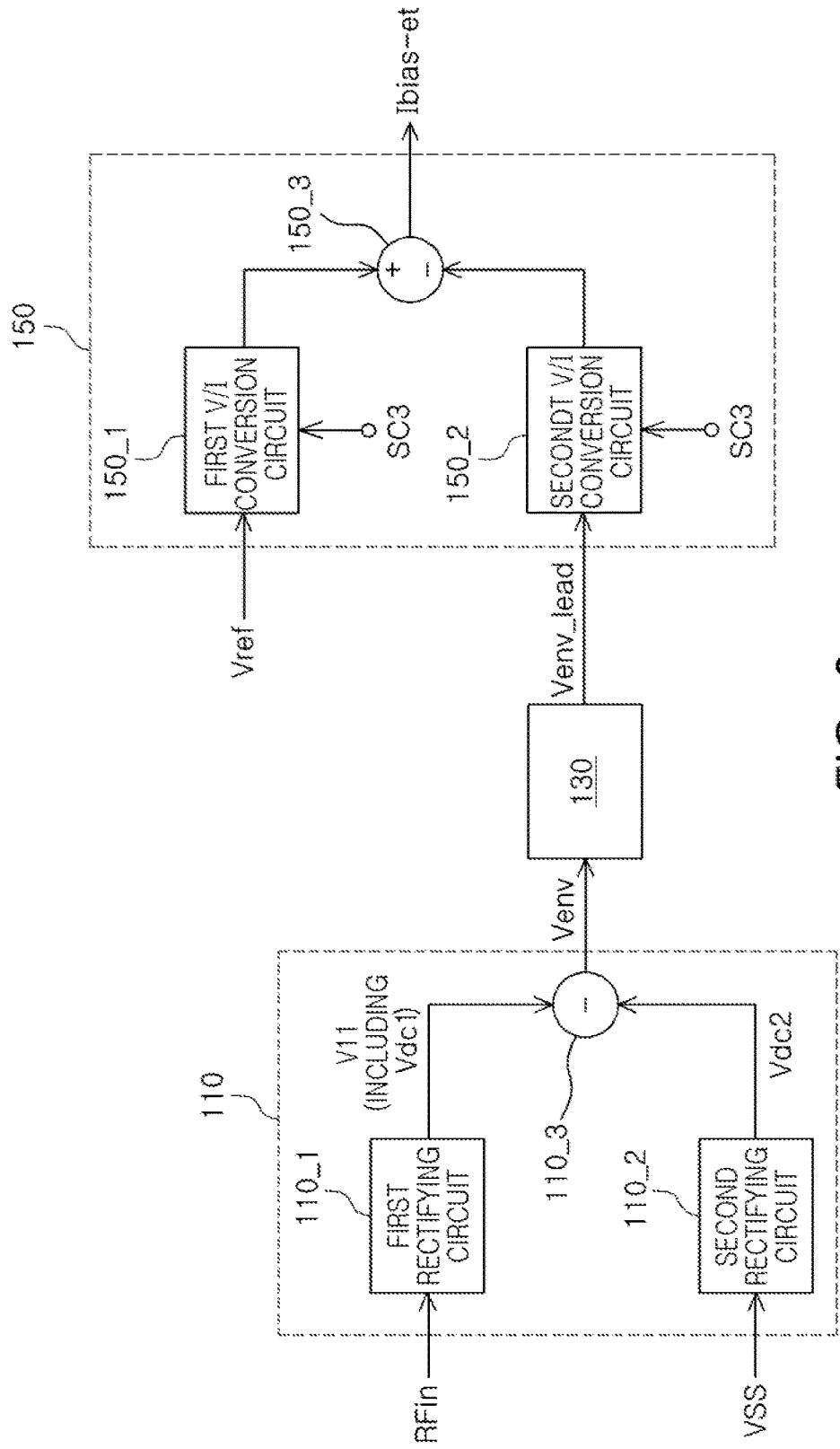
FIG. 6 is a schematic block diagram of another example of an envelope tracking current bias circuit.

FIG. 6 is a schematic block diagram of an envelope tracking current bias circuit according to another example in the present disclosure.

Referring to FIG. 6, the rectifying circuit 110 includes a first rectifying circuit 110_1, a second rectifying circuit 110_2, and a first operation circuit 110_3.

The first rectifying circuit 110_1 detects an envelope of an input RF signal RFin to output an envelope detection signal V11 including a first direct current (DC) offset voltage Vdc1.

The second rectifying circuit 110_2 outputs a second DC offset voltage Vdc2 corresponding to the first DC offset voltage Vdc1.

The first operational circuit 110_3 outputs an envelope signal Venv in which the first DC offset voltage is reduced through a subtraction between the envelope detection signal V11 and the second DC offset voltage Vdc2.

In addition, the voltage/current conversion circuit 150 may further include a first V/I conversion circuit 150_1, a second V/I conversion circuit 150_2, and a bias current generating unit 150_3.

The first V/I conversion circuit 150_1 converts a reference voltage VREF into a DC current I_dc and adjusts the DC current I_dc according to a third control signal SC3.

The second V/I conversion circuit 150_2 generates an ET current I_et using the envelope signal Venv and adjusts the ET current I_et according to a third control signal SC3. Here, the third control signal SC3 may be determined according to operation characteristics of the corresponding power amplification circuit.

In addition, the bias current generating unit 150_3 generates an ET bias current Ibias_et by calculating the DC current I_dc and the ET current I_et. As an example, the bias current generating unit 150_3 generates the ET bias current Ibias_et by adding or subtracting the DC current I_dc and the ET current I_et. Here, the addition or the subtraction may be selected according to operation characteristics of the corresponding power amplifier circuit. The operation characteristics of the corresponding power amplification circuit may be determined by at least one of a frequency band, a bandwidth, a power mode, and magnitude of output power.

Typically, a delay of about 25 nsec is generated by the ET current bias circuit when the phase is not compensated, but as set forth above, when the phase is compensated as disclosed in the examples in the present disclosure, the delayed phase may be compensated by the ET current bias circuit. Thus, improving the characteristics of the ET current bias circuit.

In addition, the adjacent channel power ratio (ACPR) may be more improved as compared to the case in which the phase is not compensated.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An envelope tracking (ET) current bias circuit, comprising:
    a rectifying circuit configured to detect an envelope voltage from a radio frequency (RF) signal;
    a phase compensation circuit configured to compensate for a phase of the envelope voltage in which the phase thereof is delayed in the rectifying circuit to output a phase compensated enveloped voltage using a phase compensation value varied responsive to a first control signal; and
    a voltage/current conversion circuit configured to convert the phase compensated envelope voltage into an ET bias current.

2. The envelope tracking current bias circuit of claim 1, wherein the phase compensation circuit comprises:
    a phase compensator configured to comprise first to n-th phase compensators that sequentially compensate for the phase of the envelope voltage from the rectifying circuit using a predetermined phase compensation value; and a selector configured to select one of first to n-th output voltages output from the first to n-th phase compensators to output the selected output voltage to the voltage/current conversion circuit.

3. The envelope tracking current bias circuit of claim 2, wherein each of the first to n-th phase compensators is configured to vary the phase compensation value for compensating for the phase of the envelope voltage output from the rectifying circuit responsive to the first control signal.

4. An envelope tracking (ET) current bias circuit, comprising:
a rectifying circuit configured to detect an envelope voltage from a radio frequency (RF) signal;
a phase compensation circuit configured to compensate for a phase of the envelope voltage in which the phase thereof is delayed in the rectifying circuit to output a phase compensated enveloped voltage; and
a voltage/current conversion circuit configured to convert the phase compensated envelope voltage into an ET bias current,
wherein the phase compensation circuit comprises:
a phase leading circuit configured to compensate for the phase of the envelope voltage from the rectifying circuit using a phase compensation value varied responsive to a first control signal to output the phase compensated envelope voltage; and
an amplification circuit configured to amplify the phase compensated envelope voltage output from the phase leading circuit to compensate for amplitude of a signal reduced by the phase leading circuit.

5. The envelope tracking current bias circuit of claim 4, wherein the phase leading circuit comprises:
a capacitor circuit connected between an input terminal and an output terminal of the phase leading circuit;
a first resistor circuit connected to the capacitor circuit in parallel; and
a second resistor circuit connected between the output terminal of the phase leading circuit and a ground and having a resistance value varied responsive to the first control signal.

6. The envelope tracking current bias circuit of claim 4, wherein the amplification circuit comprises:
an operational amplifier having an inverting input terminal and a non-inverting input terminal receiving the phase compensated envelope voltage input from the phase leading circuit;
a third resistor circuit connected between an output terminal and the non-inverting input terminal of the operational amplifier; and
a fourth resistor circuit connected between the non-inverting input terminal of the operational amplifier and a ground and having a resistance value varied responsive to the first control signal.

7. A power amplifying device, comprising:
a power amplifier configured to amplify a radio frequency (RF) signal;
an envelope tracking (ET) current bias circuit configured to generate an ET bias current to provide the generated ET bias current to the power amplifier, and the ET current bias circuit comprising:
a rectifying circuit configured to detect an envelope voltage from the RF signal;
a phase compensation circuit configured to compensate for a phase of the envelope voltage in which the phase is delayed in the rectifying circuit to output a phase compensated enveloped voltage using a phase compensation value varied responsive to a first control signal; and
a voltage/current conversion circuit configured to convert the phase compensated envelope voltage input from the phase compensation circuit into an ET bias current; and
a VCC circuit configured to generate a source voltage to provide the generated source voltage to the power amplifier.

8. The power amplifying device of claim 7, wherein the phase compensation circuit comprises:
a phase compensator configured to comprise first to n-th phase compensators that sequentially compensate for the phase of the envelope voltage from the rectifying circuit using a predetermined phase compensation value; and
a selector configured to select one of first to n-th output voltages output from the first to n-th phase compensators to output the selected output voltage to the voltage/current conversion circuit.

9. The power amplifying device of claim 8, wherein each of the first to n-th phase compensators is configured to vary the phase compensation value for compensating for the phase of the envelope voltage output from the rectifying circuit responsive to the first control signal.

10. The power amplifying device of claim 7, wherein the phase compensation circuit comprises:
a phase leading circuit configured to compensate for the phase of the envelope voltage from the rectifying circuit using the phase compensation value varied responsive to the first control signal to output the phase compensated envelope voltage; and
an amplification circuit configured to amplify the phase compensated envelope voltage output from the phase leading circuit to compensate for amplitude of a signal reduced by the phase leading circuit.

11. The power amplifying device of claim 10, wherein the phase leading circuit comprises:
a capacitor circuit connected between an input terminal and an output terminal of the phase leading circuit;
a first resistor circuit connected to the capacitor circuit in parallel; and
a second resistor circuit connected between the output terminal of the phase leading circuit and a ground and having a resistance value varied responsive to the first control signal.

12. The power amplifying device of claim 10, wherein the amplification circuit comprises:
an operational amplifier having an inverting input terminal and a non-inverting input terminal receiving the phase compensated envelope voltage input from the phase leading circuit;
a third resistor circuit connected between an output terminal and the non-inverting input terminal of the operational amplifier; and
a fourth resistor circuit connected between the non-inverting input terminal of the operational amplifier and a ground and having a resistance value varied responsive to the first control signal.

13. The power amplifying device of claim 7, wherein the rectifying circuit comprises:
a first rectifying circuit configured to detect the envelope of the RF signal and output an envelope detection signal comprising a first direct current (DC) offset voltage;

a second rectifying circuit configured to output a second DC offset voltage corresponding to the first DC offset voltage; and a first operation circuit configured to output an envelope signal in which the first DC offset voltage is reduced as a function of the envelope detection signal and the second DC offset voltage.

14. The power amplifying device of claim 13, wherein the voltage/current conversion circuit comprises:

a first V/I conversion circuit configured to convert a reference voltage into a DC current and adjust the DC current responsive to a third control signal;

a second V/I conversion circuit configured to generate an ET current using the envelope signal and adjust the ET current responsive to a third control signal SC3; and a bias current generating unit configured to generate the ET bias current based on the DC current and the ET current.

* * * * *